United States Patent [19]
Lauvray et al.

[11] Patent Number: 6,040,604
[45] Date of Patent: Mar. 21, 2000

[54] SEMICONDUCTOR COMPONENT COMPRISING AN ELECTROSTATIC-DISCHARGE PROTECTION DEVICE

[75] Inventors: Olivier J. Lauvray, Chandler; David Rodriguez, Phoenix, both of Ariz.

[73] Assignee: Motorola, Inc., Schaumburg, Ill.

[21] Appl. No.: 08/897,964

[22] Filed: Jul. 21, 1997

[51] Int. Cl.$^7$ .................................................. H01L 21/44
[52] U.S. Cl. .......................... 257/355; 257/740; 257/758; 257/774
[58] Field of Search .................................... 438/652, 597, 438/622, 598, 618, 637, 638, 666, 669, 280, 514, 527, 533; 257/776, 758, 328, 355, 740, 774

[56] References Cited

U.S. PATENT DOCUMENTS

| | | | |
|---|---|---|---|
| 4,119,440 | 10/1978 | Hile | 148/1.5 |
| 4,471,523 | 9/1984 | Hu | 29/571 |
| 4,692,190 | 9/1987 | Komatsu | 438/618 |
| 4,910,170 | 3/1990 | Motozima et al. | 438/373 |
| 5,807,098 | 9/1998 | Fiordalice et al. | 438/653 |
| 5,892,249 | 4/1999 | Courtwright et al. | 257/209 |

OTHER PUBLICATIONS

Stanley Wolf, "Silicon Processing for the VLSI Era" vol. 2: Process Integration, 1990, pp. 441–446.

*Primary Examiner*—Wael Fahmy
*Assistant Examiner*—Kurt Eaton
*Attorney, Agent, or Firm*—Rennie William Dover

[57] ABSTRACT

A semiconductor component (10) includes a substrate (11), doped regions (15, 20) in the substrate (11), interconnect layers (23, 26, 29) coupled to one of the doped layers, and dielectric layers (21, 24, 27) between the interconnect layers (23, 26, 29) wherein a portion (48) of the top interconnect layer (29) overlies portions (47, 42, 43) of the underlying interconnect layers (23, 26) and wherein a portion (47) of the middle interconnect layer (26) does not overlie the portions (42, 43) of the bottom interconnect layer (23) and also does not overlie portions (32, 33) of one of the doped regions (20).

9 Claims, 3 Drawing Sheets

SEMICONDUCTOR COMPONENT COMPRISING AN ELECTROSTATIC-DISCHARGE PROTECTION DEVICE

BACKGROUND OF THE INVENTION

This invention relates, in general, to semiconductor components, and more particularly, to electrostatic-discharge protection for semiconductor components.

Modern integrated circuits must resist higher electrostatic-discharge (ESD) stresses of greater than several kilovolts human body model or several hundred volts machine model. Improving ESD protection also improves the robustness or reliability of the integrated circuit. Prior art approaches for improving ESD protection include increasing the size of the ESD structure, using more complex ESD protection circuitry, or using lower impedance structures to minimize the ESD current density or the ESD voltage. However, these prior art techniques also have drawbacks, which include increased size, cost, and complexity of the semiconductor component.

Accordingly, a need exists for improved ESD protection without increasing the size, cost, or complexity of the semiconductor component.

DETAILED DESCRIPTION OF THE DRAWINGS

Figure 1:
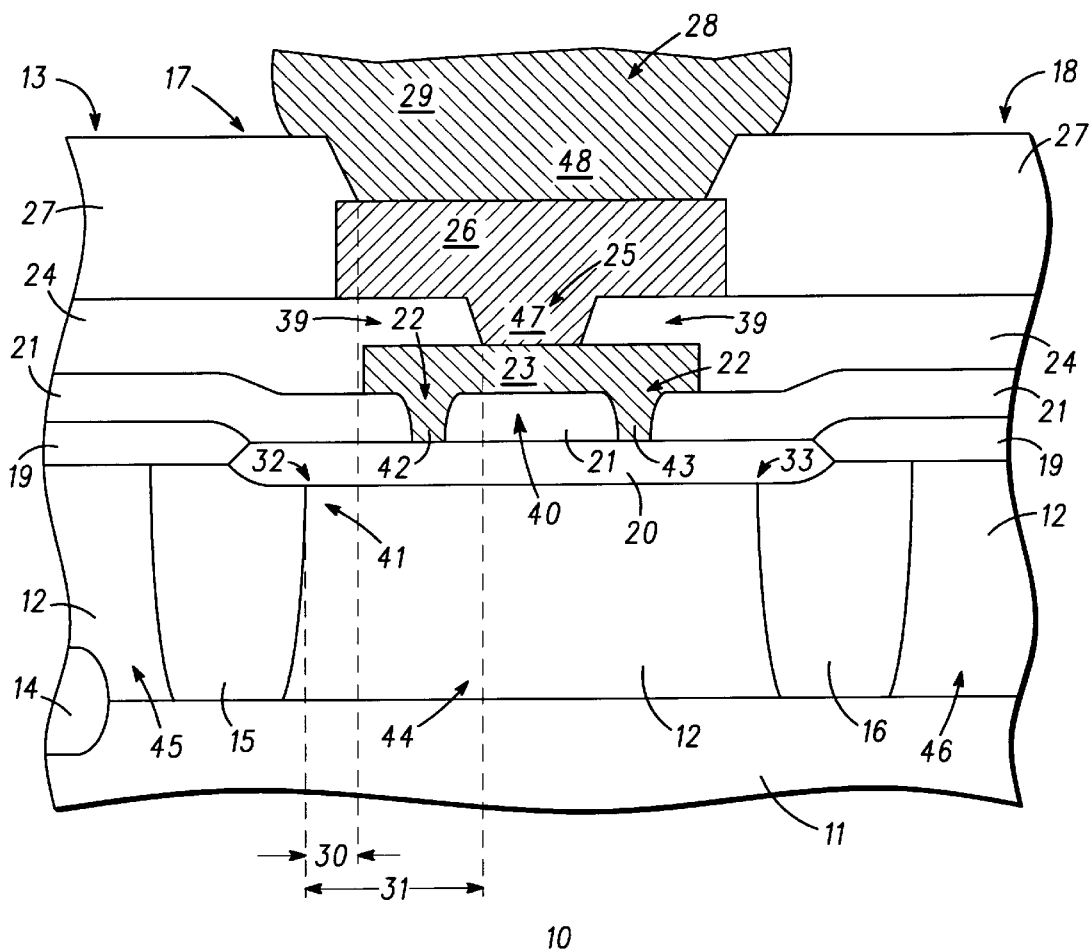
FIG. 1 illustrates a partial cross-sectional view of an embodiment of a semiconductor component in accordance with the present invention.

FIG. 1 illustrates a partial cross-sectional view of an embodiment of a semiconductor component 10. In the preferred embodiment, component 10 is an integrated circuit and includes, among other features, semiconductor devices 13, 17, and 18. Devices 13 and 18 represent any devices used in an integrated circuit such as, for example, bipolar or field effect transistors. Device 17 represents an electrostatic-discharge (ESD) protection device. The preferred method for manufacturing these exemplary devices is described herein.

A substrate 11 supports component 10 and includes an epitaxial layer 12. Substrate 11 can have a first doping concentration and a first conductivity type while layer 12 can have a second doping concentration and a second conductivity type different from the first conductivity type. As an example, the first conductivity type is p-type; the first doping concentration is approximately $10^{10}$–$10^{11}$ atoms per centimeter cubed ($cm^{-3}$); the second conductivity type is n-type; and the second doping concentration is approximately $10^{11}$–$10^{12}$ $cm^{-3}$.

First doped regions 15 and 16 formed in and through a portion of layer 12 separate or isolate layer 12 into portions 44, 45, and 46. As an example, regions 15 and 16 have the first conductivity type and are implanted and/or diffused into layer 12 to a doping concentration of approximately $10^{17}$–$10^{19}$ $cm^{-3}$. In the preferred embodiment, regions 15 and 16 are portions of the same isolation region that circumscribes and isolates portion 44 from other portions of layer 12. Also in the preferred embodiment, an electrical contact (not shown) is coupled to regions 15 and 16 from the top surface of layer 12 to reduce series resistance.

Next, a field oxide 19 can be grown over layer 12 using oxidation processes known in the art. In the preferred embodiment, field oxide 19 is not grown over the surface of portion 44 in layer 12 to facilitate the manufacturing of ESD protection device 17. Instead, field oxide 19 is preferably grown in a circular or octagonal pattern, which is concentric with doped regions 15 and 16 and which circumscribes portion 44 of layer 12. Although not illustrated in the partial view of FIG. 1, field oxide 19 is also preferably not grown over a central portion of portions 45 and 46 to facilitate the manufacturing of devices 13 and 18, respectively.

Formed in portion 45 of layer 12, device 13 can be a lateral bipolar transistor that uses a buried layer 14. Formed in portion 46 of layer 12, device 18 can be a metal-oxide-semiconductor field-effect transistor (MOSFET). Devices 13 and 18 are simplified to facilitate the explanation of component 10. The specific methods of forming devices 13 and 18 are known in the art.

ESD protection device 17 is formed in portion 44 of layer 12 by, among other things, forming a second doped region 20 in a top area of portion 44. As portrayed in FIG. 1, region 20 is absent from a bottom area 41 of portion 44. Region 20 has the second conductivity type and a doping concentration greater than the doping concentration of layer 12 and substrate 11. As an example, region 20 has a doping concentration of approximately $10^{17}$–$10^{20}$ $cm^{-3}$ and can be formed simultaneously with source and drain regions (not shown) of MOSFET or device 18. In the preferred embodiment, doped region 20 is either a single continuos region or a donut-shaped region. In an undepicted alternative embodiment, doped region 20 is comprised of a plurality of doped regions.

A portion 32 of region 20 contacts region 15 and contacts bottom area 41 of portion 44 wherein area 41 of portion 44 is outside regions 15 and 20. A portion 33 of region 20 is symmetrically similar to portion 32 of region 20. In other words, portion 33 contacts region 16 and contacts the bottom area of portion 44. To facilitate the explanation of component 10, all subsequent references to portion 32 of region 20 similarly apply to portion 33 of region 20.

Next, a dielectric layer 21 is formed over field oxide 19, layer 12, and doped regions 15, 16, and 20. Layer 21 can be formed using vapor deposition, thermal growth, or other similar processes. Layer 21 can be comprised of a single layer of oxide or nitride, but layer 21 is preferably comprised of a plurality of oxide and/or nitride layers. For example, layer 21 can be comprised of approximately 10–50 nanometers (nm) of a thermally grown gate oxide formed for MOSFET device 18 and can also be comprised of approximately 300–700 nm of an interlayer dielectric such as boron-phosphorous-silicate glass.

At least one via is etched into dielectric layer 21 to facilitate electrical contact to ESD protection device 17. In FIG. 1, a cross-section of component 10 reveals vias 22. From a top view (not shown) of component 10, vias 22 are preferably portions of a single via, which has a circular or ring shape and is concentric with field oxide 19 and doped regions 15 and 16.

Next, an interconnect layer 23 is formed over portion 44 of layer 12, doped region 20, and dielectric layer 21. Interconnect layer 23 can be formed by sputtering, plating, or evaporating a metal layer and then patterning the metal layer. Layer 23 can be approximately 500–1,000 nm thick and can be comprised of aluminum, copper, silicon, titanium, tungsten, or gold. Portions 42 and 43 of layer 23 are formed in or fill up vias 22 and contact different portions of region 20 to provide electrical coupling to ESD protection device 17. As illustrated in FIG. 1, portions 42 and 43 are coupled or connected together by another portion of layer 23, and a portion 40 of dielectric layer 21 is located adjacent to and between portions 42 and 43 of interconnect layer 23. For reasons explained later, vias 22 and interconnect layer 23 are preferably formed such that portion 32 of region 20 is kept outside a section of region 20 that underlies portions 42 and 43 of layer 23.

A dielectric layer 24 is formed over interconnect layer 23, dielectric layer 21, and doped region 20. Layer 24 can be formed using techniques similar to those used to form layer 21, and layer 24 can be composed of similar materials as layer 21. In the preferred embodiment, layer 24 is comprised of approximately 500–2,000 nm of a plasma enhanced oxide.

A via 25 is formed in dielectric layer 24 using etching techniques known in the art. Via 25 is formed such that a portion 39 of dielectric layer 24 is adjacent to via 25 and preferably remains over portion 42 of interconnect layer 23.

An interconnect layer 26 is formed over interconnect layer 23 and dielectric layer 24. Interconnect layer 26 can be approximately 1,000–3,000 nm thick, can be similar in composition to interconnect layer 23, and can be formed using similar techniques as those used to form layer 23. A portion 47 of layer 26 overlies doped region 20, overlies portion 40 of dielectric layer 21, and is formed in or fills up via 25 to physically contact layer 23;

A dielectric layer 27 is formed over interconnect layer 26, and a via 28 is formed in layer 27. Layer 27 can be similar to layers 21 and 24, and via 28 can be formed using etch techniques similar to those used to form vias 25 and 22. Via 28 overlies vias 25 and 22, portion 47 of layer 26, and portions 42 and 43 of layer 23. In the preferred embodiment, layer 27 is a gettering or passivation layer comprised of nitride or polyimide.

Then, an interconnect layer 29 is formed inside via 28 of passivation layer 27 and over interconnect layer 26 and doped region 20. In the preferred embodiment, layer 29 is a metallic wire bond. A portion 48 of interconnect layer 29 is formed in via 28 and contacts interconnect layer 26. Similar to via 28, portion 48 overlies portion 47 of interconnect layer 26 and also overlies portions 42 and 43 of interconnect layer 23.

Unlike the prior art, portions 42 and 43 of interconnect layer 23 electrically contact an area of doped region 20 that underlies via 28 but that does not underlie via 25. If via 28 overlies via 25 and if via 25 overlies vias 22, then the physical bonding pressure of wire bond or interconnect layer 29 is transferred through interconnect layer 26 through interconnect layer 23 and into doped region 20. The pressure or stress may also be caused by probe needles (not shown) on interconnect layer 26 during electrical testing of component 10 before the formation of interconnect layer 29. The pressure is transferred through interconnect layers 26 and 23 because of their malleable nature, and if the pressure is transferred into doped region 20, the crystalline structure of region 20 may be disrupted and ESD protection device 17 will have higher leakage currents and poorer reliability, among other problems.

However, in the embodiment of FIG. 1 where interconnect layer 29 is a metallic wire bond, the pressure from the wire bonding process will not severely damage doped region 20 because portions 42 and 43 of interconnect layer 23 are protected by overlying portions 39 of dielectric layer 24. The rigidity of dielectric layer 24 provides the necessary protection against the physical bonding pressure when forming interconnect layer 29. In other words, the pressure from interconnect layer 26 is transferred into underlying portion 39 of dielectric layer 24, but is not transferred into underlying portions 42 and 43 of interconnect layer 23 or doped region 20. Additional protection of doped region 20 is provided by portion 40 and other portions of dielectric layer 21 that are located underneath via 28 and that separate or are located between interconnect layer 23 and doped region 20.

Therefore, as illustrated in FIG. 1, vias 22 of dielectric layer 21 and portions 42 and 43 of interconnect layer 23 are located under via 28 to conserve space, but via 25 of dielectric layer 24 and portion 47 of interconnect layer 26 do not overlie vias 22 and portions 42 and 43. Instead, portions 39 of dielectric layer 24 are located between interconnect layer 26 and portions 42 and 43 of interconnect layer 23.

An additional aspect of component 10 is that portion 32 of doped region 20 is not located underneath via 25 and portion 47 of interconnect layer 26. In other words, a horizontal distance 31 between portion 32 and via 25 is zero or greater. Preferably, portion 32 of doped region 20 is also absent from underneath portion 39 of dielectric layer 24, via 28, and portion 48 of interconnect layer 29. In other words, a horizontal distance 30 between portion 32 and via 28 is preferably also zero or greater. In the preferred embodiment, distances 30 and 31 are both greater than zero to provide additional protection from the wiring bonding pressure.

Yet another aspect of component 10 is that doped region 20 and layer 12 physically contact each other and have the same conductivity type. Unlike the prior art, a lightly doped region of a different conductivity type is not located between doped region 20 and layer 12 in a central portion of portion 44. Therefore, even if the pressure from the wiring bonding process or electrical probing process is transferred into layer 12 and the crystalline structure of layer 12 is damaged, excess leakage current will not be produced.

Figure 2:
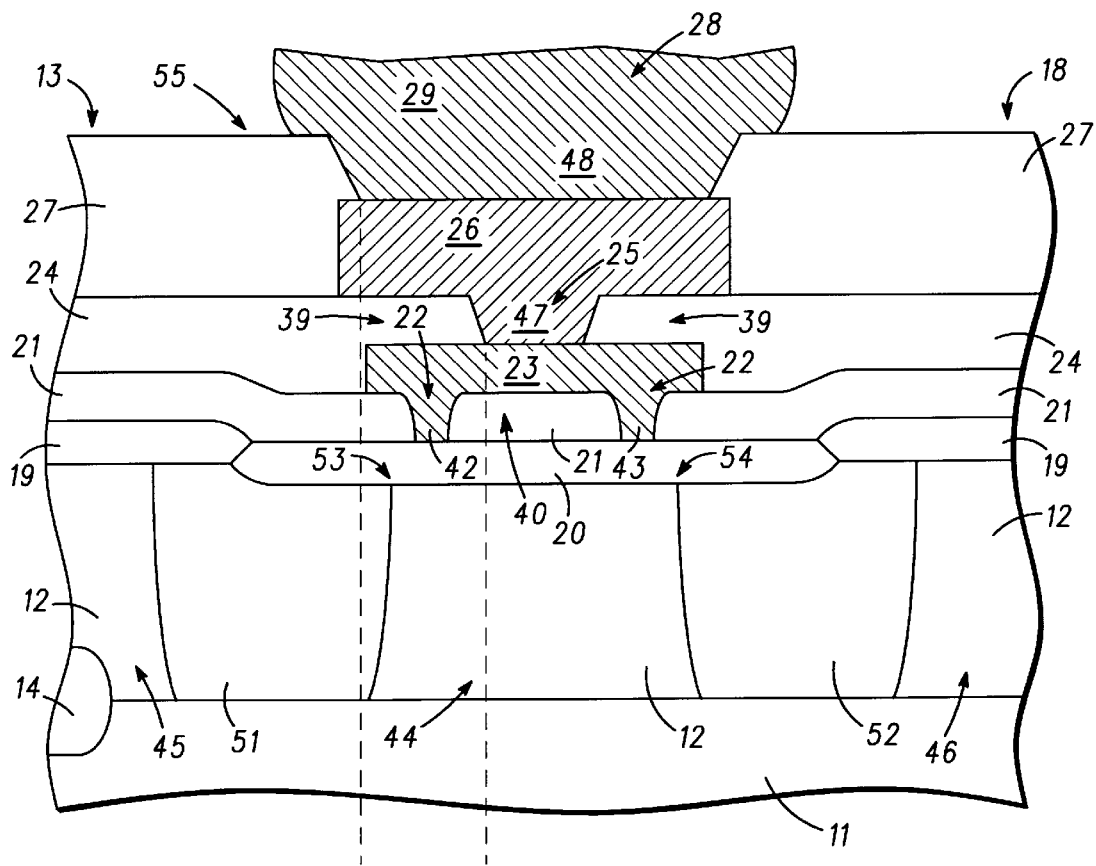
FIGS. 2 and 3 portray partial cross-sectional views of alternative embodiments of the semiconductor component in accordance with the present invention.
Figure 3:
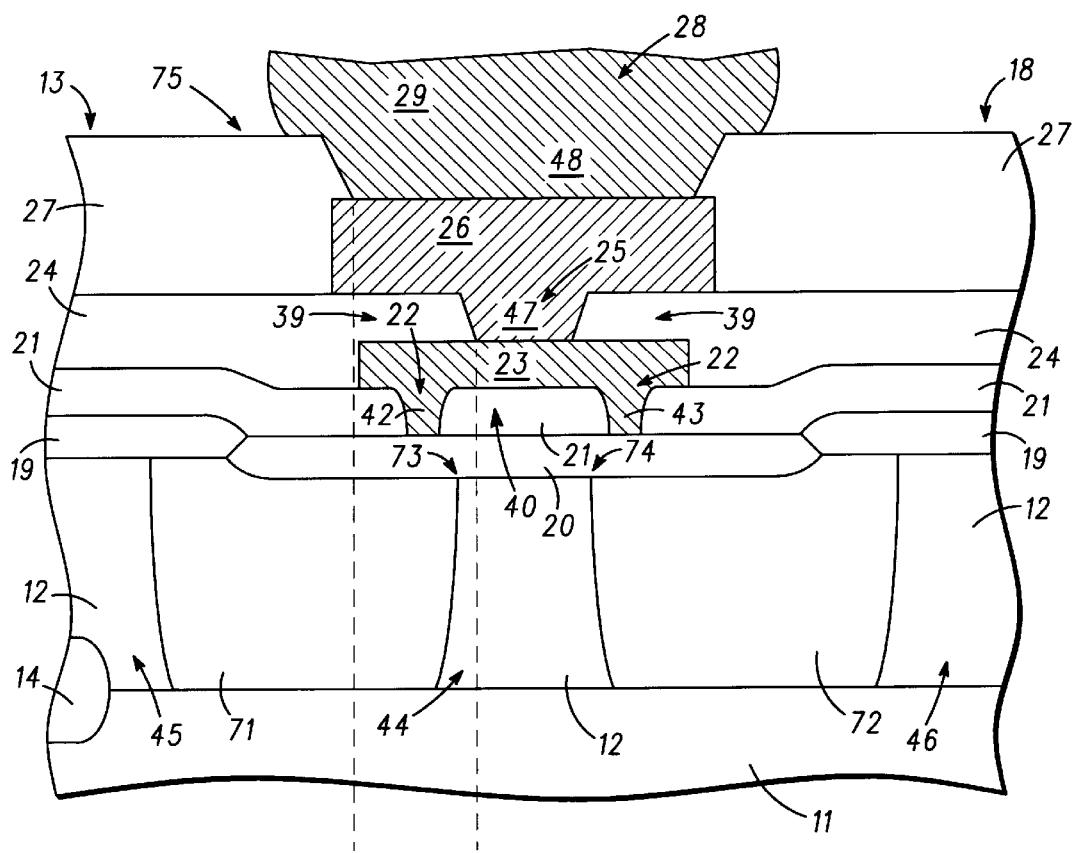

FIGS. 2 and 3 portray partial cross-sectional views of alternative embodiments of semiconductor component 10. It is understood that the same reference numerals in different figures denote the same elements.

A semiconductor component 50 in FIG. 2 includes an ESD protection device 55 and doped regions 51 and 52 that are similar to doped regions 15 and 16 of FIG. 1. ESD protection device 55 includes portions 53 and 54 of doped region 20, which are similar to portions 32 and 33, respectively, of doped region 20 in FIG. 1. Regions 51 and 52 are closer to each other compared to regions 15 and 16 of FIG. 1 such that portions 53 and 54 of doped region 20 are located underneath via 28 of dielectric layer 27 and portion 48 of interconnect layer 29. However, portions 53 and 54 of doped region 20 are still absent from underneath via 25 of dielectric layer 24 and portion 47 of interconnect layer 26.

A semiconductor component 70 in FIG. 3 includes an ESD protection device 75 and doped regions 71 and 72 that are similar to doped regions 15 and 16 of FIG. 1. ESD protection device 75 includes portions 73 and 74 of doped region 20, which are similar to portions 32 and 33, respectively, of doped region 20 in FIG. 1. Regions 71 and 72 are closer to each other compared to regions 51 and 52 of FIG. 2 such that portions 73 and 74 of doped region 20 are located underneath via 28 of dielectric layer 27 and portion 48 of interconnect layer 29. However, portions 73 and 74 of doped region 20 are still absent from underneath via 25 of dielectric layer 24 and portion 47 of interconnect layer 26.

Therefore, it is apparent there has been provided an improved semiconductor component that overcomes the disadvantages of the prior art. An ESD protection device and its accompanying interconnect system provide compact, low cost, and easily manufactured ESD protection for a semiconductor component. To conserve space in the semiconductor component, a via in the top passivation layer and a portion of the top interconnect layer overlie vias in underlying dielectric layers and also overlie portions of underlying interconnect layers in those vias. However, to improve the electrical performance and reliability of the semiconductor component, the via in a middle passivation layer and a portion of a middle interconnect layer do not overlie vias in the bottom dielectric layer, portions of the bottom interconnect layer in those vias, or portions of a doped region contacting an isolation region.

While the invention has been particularly shown and described with reference to preferred embodiments, it will be understood by those skilled in the art that changes in form and detail may be made without departing from the spirit and scope of the invention. For instance, the numerous details set forth herein such as, for example, doping concentrations and material compositions are provided to facilitate the understanding of the present invention and are not provided to limit the scope of the invention. Furthermore, the interconnect systems described for components 10, 50, and 70 are not limited to two-layer interconnect systems used with wire bonds, but are also applicable to interconnect systems having three or more layers of interconnect as well.

Accordingly, the disclosure of the present invention is not intended to be limiting. Instead, the disclosure of the present invention is intended to be merely illustrative of the scope of the invention, which is set forth in the following claims.

We claim:

1. A semiconductor component comprising:
   a substrate;
   a first doped region in the substrate;
   an electrostatic-discharge protection device in the substrate comprising a second doped region in the substrate wherein a first portion of the second doped region contacts the first doped region at a first portion of the substrate;
   a first interconnect layer overlying the electrostatic-discharge protection device, wherein a ring-shaped portion of the first interconnect layer overlies and contacts a second portion of the second doped region;
   a second interconnect layer overlying the first interconnect layer and the electrostatic-discharge protection device, wherein a portion of the second interconnect layer overlies and contacts the first interconnect layer, overlies the electrostatic-discharge protection device, is devoid of overlying the ring-shaped portion of the first interconnect layer, and is devoid of overlying the first and second portions of the second doped region; and
   a third interconnect layer overlying the first and second interconnect layers and the electrostatic-discharge protection device, wherein a portion of the third interconnect layer overlies and contacts the second interconnect layer, overlies the electrostatic-discharge protection device, and overlies the portions of the first and second interconnect layers.

2. The semiconductor component of claim 1 wherein the portions of the first and third interconnect layers are devoid of overlying the first doped region.

3. The semiconductor component of claim 1 wherein the portion of the third interconnect layer overlies the first doped region, and
   wherein the ring-shaped portion of the first interconnect layer is devoid of overlying the first doped region.

4. The semiconductor component of claim 1 wherein the portions of the first and third interconnect layers overlie the first doped region.

5. The semiconductor component of claim 1 wherein the portion of the third interconnect layer is larger than the portion of the second interconnect layer.

6. A semiconductor component comprising:
   a semiconductor substrate having a first conductivity type and a first doping concentration;
   a first doped region in the semiconductor substrate, the first doped region having a second conductivity type and separating the semiconductor substrate into first and second portions;
   a semiconductor device in the first portion of the semiconductor substrate;
   an electrostatic-discharge protection device in the second portion of the semiconductor substrate comprising a second doped region in a first area of the second portion of the semiconductor substrate, the second doped region having the first conductivity type and a second doping concentration greater than the first doping concentration, wherein a first portion of the second doped region contacts the first doped region at a second area of the second portion of the semiconductor substrate;
   a first dielectric layer over the semiconductor substrate and the electrostatic-discharge protection device, the first dielectric layer having a ring-shaped via exposing the second doped region, the via of the first dielectric layer overlying the electrostatic-discharge protection device;
   an interconnect layer over the first dielectric layer and in the ring-shaped via of the first dielectric layer to contact the second doped region;
   a second dielectric layer over the interconnect layer, the semiconductor substrate, and the electrostatic-discharge protection device, the second dielectric layer having a via not overlying the ring-shaped via and exposing the interconnect layer, the via in the second dielectric layer overlying the electrostatic-discharge protection device and devoid of overlying the ring-shaped via in the first dielectric layer and the first portion of the second doped region;
   a metal layer over the second dielectric layer and in the via of the second dielectric layer to contact the interconnect layer;
   a third dielectric layer over the metal layer, the semiconductor substrate, and the electrostatic-discharge protection device, the third dielectric layer having a via exposing the metal layer, the via in the third dielectric layer overlying the vias in the first and second dielectric layers and the electrostatic-discharge protection device, the via in the third dielectric layer larger than the vias in the first and second dielectric layers; and
   a wire bond in the via of the third dielectric layer to contact the metal layer.

7. The semiconductor component of claim 6 wherein the vias in the first and third dielectric layers are devoid of overlying the first portion of the second doped region.

8. The semiconductor component of claim 6 wherein the ring-shaped via in the first dielectric layer is devoid of overlying the first portion of the second doped region, and wherein the via in the third dielectric layer overlies the first portion of the second doped region.

9. The semiconductor component of claim 6 wherein the vias in the first and third dielectric layers overlie the first portion of the second doped region.

\* \* \* \* \*